United States Patent
Otsuka (10) Patent No.: US 9,461,056 B2
(45) Date of Patent: *Oct. 4, 2016

(54) NON-VOLATILE MEMORY AND SEMICONDUCTOR DEVICE

(71) Applicant: LAPIS SEMICONDUCTOR CO., LTD., Yokohama (JP)

(72) Inventor: Masayuki Otsuka, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/930,827

(22) Filed: Nov. 3, 2015

(65) Prior Publication Data
US 2016/0056163 A1 Feb. 25, 2016

Related U.S. Application Data

(63) Continuation of application No. 13/862,290, filed on Apr. 12, 2013, now Pat. No. 9,202,589.

(30) Foreign Application Priority Data

Apr. 13, 2012 (JP) ................................ 2012-092459

(51) Int. Cl.
| | |
|---|---|
| *G11C 17/16* | (2006.01) |
| *H01L 27/112* | (2006.01) |
| *G11C 17/18* | (2006.01) |
| *H01L 29/866* | (2006.01) |

(52) U.S. Cl.
CPC ......... *H01L 27/11206* (2013.01); *G11C 17/16* (2013.01); *G11C 17/18* (2013.01); *H01L 29/866* (2013.01)

(58) Field of Classification Search
CPC ........................................................ G11C 5/06
USPC .............................................................. 365/51
See application file for complete search history.

(56) References Cited

U.S. PATENT DOCUMENTS

| | | | | |
|---|---|---|---|---|
| 4,451,839 A | * | 5/1984 | Nelson | H01L 27/0814 257/529 |
| 5,483,482 A | * | 1/1996 | Yamada | G11C 11/34 257/906 |

(Continued)

FOREIGN PATENT DOCUMENTS

| | | |
|---|---|---|
| JP | S59-132159 A | 7/1984 |
| JP | S61-240673 A | 10/1986 |

(Continued)

OTHER PUBLICATIONS

An Office Action; "Notice of Reasons for Rejection," issued by the Japanese Patent Office on Jan. 19, 2016, which corresponds to Japanese Patent Application No. 2012-092459 and is related to U.S. Appl. No. 14/930,827; with English language translation.

(Continued)

*Primary Examiner* — Min Huang
(74) *Attorney, Agent, or Firm* — Studebaker & Brackett PC (57) ABSTRACT

There is provided a non-volatile memory including: plural zener zap devices, each including a cathode region and an anode region formed in a well; and a metal wiring line that is formed above the plural zener zap devices, that is commonly connected to each of the cathode regions, and that supplies a write voltage to each of the zener zap devices.

13 Claims, 11 Drawing Sheets

(56) References Cited

U.S. PATENT DOCUMENTS

| | | | | |
|---|---|---|---|---|
| 5,818,749 | A * | 10/1998 | Harshfield | G11C 11/56 257/E27.004 |
| 7,145,255 | B2 * | 12/2006 | Lutz | G11C 17/16 257/529 |
| 2002/0079956 | A1 | 6/2002 | Ikehashi et al. | |
| 2003/0006832 | A1 | 1/2003 | Ikehashi et al. | |
| 2003/0218497 | A1 | 11/2003 | Ikehashi et al. | |
| 2005/0212086 | A1 * | 9/2005 | Unterleitner | H01L 29/866 257/565 |
| 2011/0002157 | A1 * | 1/2011 | Shimomura | G11C 11/16 365/148 |
| 2012/0211747 | A1 * | 8/2012 | Stribley | H01L 23/5252 257/49 |

FOREIGN PATENT DOCUMENTS

| | | |
|---|---|---|
| JP | H04-348068 A | 12/1992 |
| JP | 2000-058794 A | 2/2000 |
| JP | 2003-204069 A | 7/2003 |
| JP | 2005-182899 A | 7/2005 |
| JP | 2009/283602 A | 12/2009 |

OTHER PUBLICATIONS

An Office Action; "Notice of Reasons for Rejection" issued by the Japanese Patent Office on Jul. 26, 2016, which corresponds to Japanese Patent Application No. 2012-092459 and is related to U.S. Appl. No. 14/930,827; with English language translation.

* cited by examiner

FIG.2

FIG.3 pac: P-TYPE ACTIVE REGION

FIG.11 pac: P-TYPE ACTIVE REGION

NON-VOLATILE MEMORY AND SEMICONDUCTOR DEVICE

CROSS-REFERENCE TO RELATED APPLICATION

This application is a continuation of U.S. application Ser. No. 13/862,290, filed on Apr. 12, 2013, which claims priority to Japanese Application No. 2012-092459 filed on Apr. 13, 2012, the disclosure of which is incorporated by reference herein.

BACKGROUND

1. Technical Field

The present invention relates to a non-volatile memory (also referred to below as PROM) that employs zener zap devices (also referred to below as ZapFuses) and to a semiconductor device thereof. The present invention particularly relates to a non-volatile memory suitable for suppressing heat generation during data writing accompanying increasing capacities, and to a semiconductor device of the same.

2. Related Art

As disclosed in for example Japanese Patent Application Laid-Open (JP-A) No. 2003-204069, in a zener zap device with a zap diode configured by forming a P-type well region in a surface layer of an N-type semiconductor layer, forming a P-type anode region and an N-type cathode region in the P-type well region, and with the P-type anode region and the N-type cathode region respectively connected through an anode electrode and a cathode electrode, the PN junction is broken down by applying a reverse bias voltage of a breakdown voltage or greater so as to short between the anode electrode and the cathode electrode and act as a resistor.

A PROM employing zener zap devices as storage units for single bits operates in a data write mode that zaps the zener zap devices for each bit, and in a read mode that reads the written data. In the read mode, a method and a circuit configuration are employed in which a current is applied to each of the zener zap devices for every bit, and the data of each bit is read to be transmitted to an operation circuit.

As disclosed in for example JP-A No. 2005-182899, it is necessary to provide the number of zener zap devices that matches the required storage capacity in the PROM.

Figure 10:
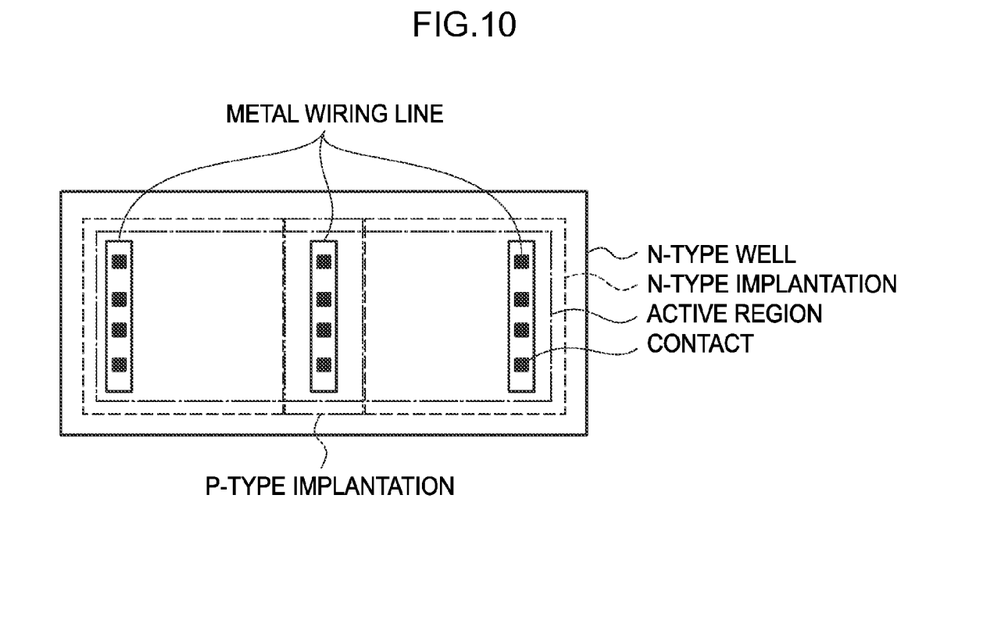
FIG. 10 is a layout diagram illustrating a configuration example of a related zener zap device.
Figure 11:
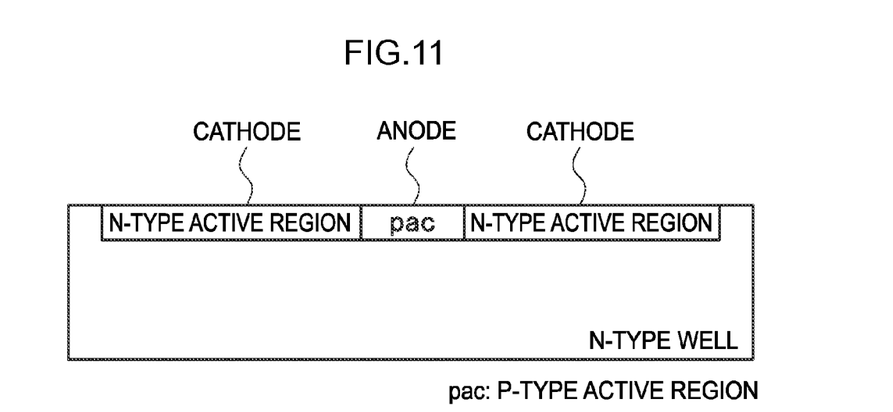
FIG. 11 is a cross-section illustrating a configuration example of the zener zap device illustrated in FIG. 10.

As shown in the layout diagram of FIG. 10 and the cross-section of FIG. 11, a single zener zap device (Zap-Fuse) is configured including an N-type well, active regions, an N-type implant region, a P-type implant region, contacts and metal wiring lines.

The N-type active region in FIG. 11 is a region formed by performing N-type implantation (for example phosphorous ion or arsenic ion implantation) in an active region formed above the N-type well of FIG. 10. Moreover, the P-type active region in FIG. 11 (denoted "pac" in the drawings) is a region formed by performing P-type implantation (for example boron ion or $BF_2$ ion implantation) in the active region formed above the N-type well of FIG. 10.

Figure 12:
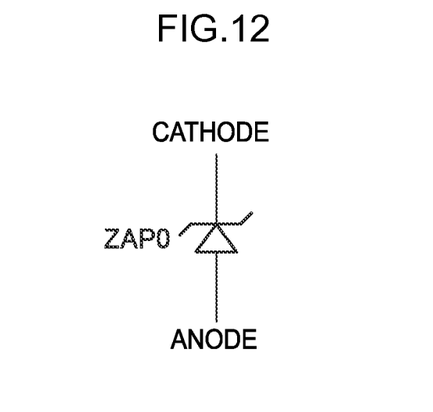
FIG. 12 is a circuit diagram illustrating a circuit configuration example of the zener zap device illustrated in FIG. 11.

This zener zap device (ZapFuse) is represented by the circuit diagram of FIG. 12. As shown in FIG. 12, a zener zap device ZAP0 is provided with two terminals, an anode and a cathode.

The P-type active region of FIG. 11 is the anode of FIG. 12, and the N-type active region in FIG. 11 is the cathode of FIG. 12.

Figure 13:
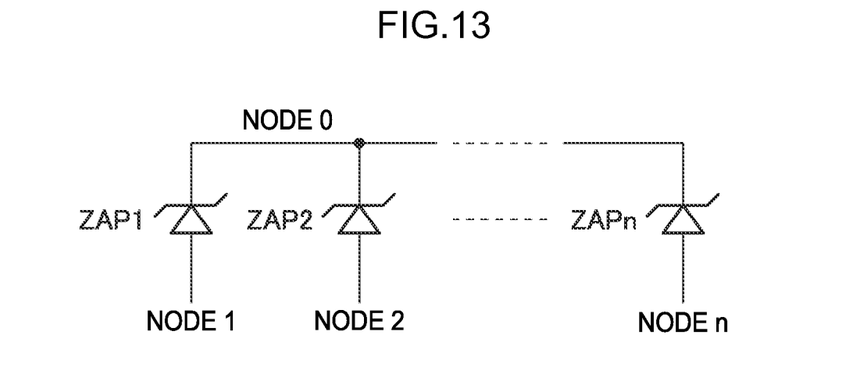
FIG. 13 is a circuit diagram illustrating a configuration example of a non-volatile memory employing plural of the zener zap devices illustrated in FIG. 12.

FIG. 13 illustrates a PROM circuit configuration with n (n being an integer of 2 or more) cathodes of the zener zap devices as illustrated in FIG. 12 connected to a common line (node 0).

In FIG. 13, the respective cathodes of a zener zap device ZAP1 to a zener zap device ZAPn are each commonly connected to the node 0. The anodes of the zener zap device ZAP1 to the zener zap device ZAPn are each respectively connected to node 1 to node n.

Figure 14:
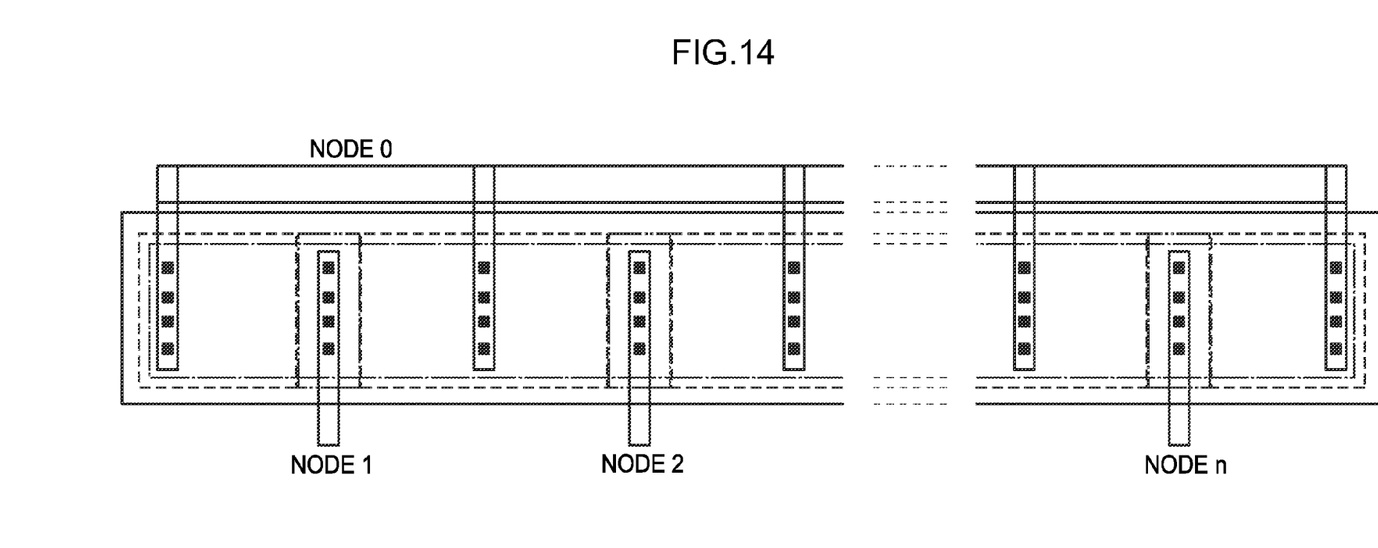
FIG. 14 is a layout diagram illustrating a configuration example of the non-volatile memory illustrated in FIG. 13.

FIG. 14 shows an example of a wiring layout of metal wiring lines in the PROM illustrated of the circuit diagram in FIG. 13.

Node 0 to node n in FIG. 14 respectively correspond to node 0 to node n in FIG. 13.

For PROM employing zener zap devices as storage units for single bits, various known technology is proposed relating to increasing capacities of PROM, such as disclosed in for example JP-A No. 2003-204069, to enable economical electrical writing on a small-scale and featuring high reliability after writing.

However, with such known technology relating to increasing PROM to high capacities, there is an issue that the surface area increases as the number of storage units (zener zap devices) is increased to achieve a higher capacity, and no consideration is given to the heat generation that accompanies such an increase in the number of zener zap devices.

Namely, in the configurations illustrated in FIG. 10 to FIG. 14, a large current flows due to zener breakdown during zener zap device writing. The zener zap devices accordingly generate heat, and due to the heat, metal in the wiring lines connected to the anodes and the cathodes increases in resistance. There is moreover also an issue of a deterioration in reliability of wiring lines due to electromigration and stress migration. These issues are particularly serious accompanying increasing capacities of non-volatile memory (PROM).

SUMMARY

The present invention is configured to address the above issues, and an object thereof is to avoid an increase in heat during data writing accompanying increasing capacities in non-volatile memory (PROM) using zener zap devices.

A first aspect of the present invention provides a non-volatile memory including:

plural zener zap devices, each including a cathode region and an anode region formed in a well; and a metal wiring line that is formed above the plural zener zap devices, that is commonly connected to each of the cathode regions, and that supplies a write voltage to each of the zener zap devices.

A second aspect of the present invention provides a semiconductor device including:

the non-volatile memory of the first aspect; and a central processing unit that performs writing and reading of data employing the non-volatile memory.

According to the present invention, it is possible to avoid an increase in heat during data writing accompanying increasing capacities of non-volatile memory (PROM) using zener zap devices (ZapFuses), enabling stabilization to be achieved in the operation of a semiconductor device and an electronic device provided with the non-volatile memory (PROM) of the present invention.

BRIEF DESCRIPTION OF THE DRAWINGS

An exemplary embodiment of the present invention will be described in detail based on the following figures, wherein.

DETAILED DESCRIPTION

Explanation follows regarding an exemplary embodiment of the present invention with reference to the drawings.

Figure 1:
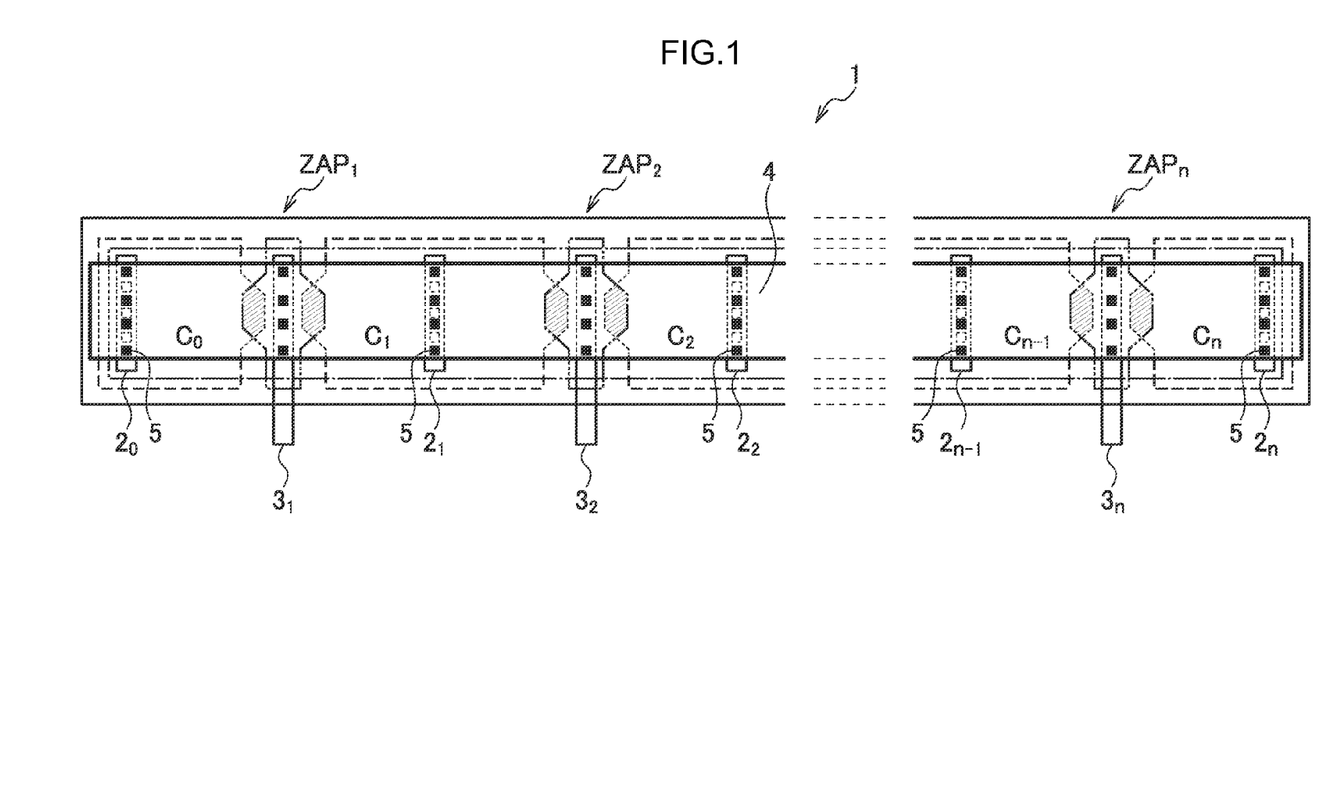
FIG. 1 is a layout diagram illustrating a configuration example of a non-volatile memory according to an exemplary embodiment.

FIG. 1 illustrates a configuration of a non-volatile memory (referred to as PROM in the drawings) 1. The non-volatile memory 1 is provided with zener zap devices $ZAP_1$ to $ZAP_n$ (n being an integer of 2 or greater) that include electrodes $2_0$ to $2_n$ respectively connected to cathode regions $C_0$ to $C_n$, electrodes $3_1$ to $3_n$ connected to anode regions $A_1$ to $A_n$, and a metal wiring line 4.

Figure 2:
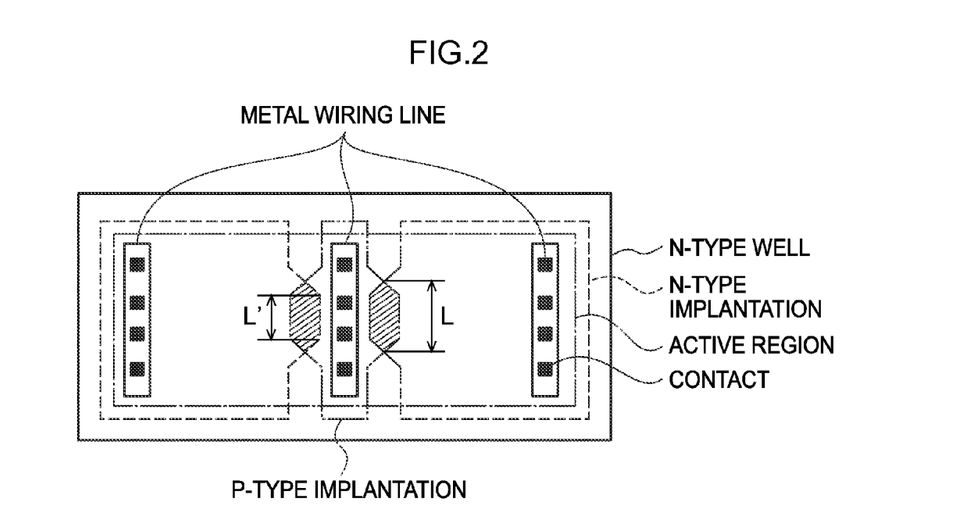
FIG. 2 is a layout diagram illustrating a configuration example of a zener zap device illustrated in FIG. 1.
Figure 3:
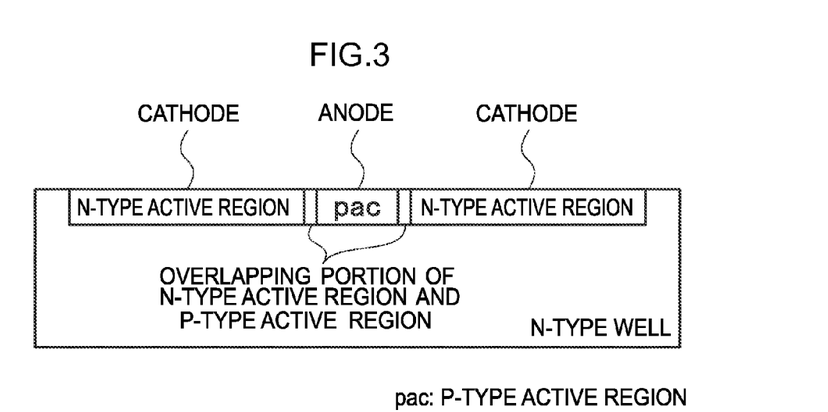
FIG. 3 is a cross-section illustrating a configuration example of the zener zap device illustrated in FIG. 2.

The zener zap devices $ZAP_1$ to $ZAP_n$ are zener zap devices configured as shown in FIG. 2 and FIG. 3.

The zener zap device illustrated in FIG. 2 and FIG. 3 differs from the zener zap devices illustrated in FIG. 10 and FIG. 11 explained in the related technology due to being provided with the shaded portions in FIG. 2, namely the overlapping N-type active region and P-type active region portions (dual-presence regions) in FIG. 3.

The non-volatile memory 1 of the present exemplary embodiment is thus provided with regions where both N-type active regions formed by N-type implantation and P-type active region formed by P-type implantation are present together. The metal wiring line 4 is formed in a well so as to at least cover the dual-presence portions of the cathode region and anode region (the shaded portion in the drawings).

Note that a width L at the overlapping portions (dual-presence regions) is formed with wider widths than the standard respective active widths of P-type active region and N-type active regions, i.e., L'. Here, the widths L' indicate widths of protruding edges of the P-type active region and N-type active regions.

In the present zener zap devices, data writing is performed by zener breakdown of one or other of the portions where both the N-type active regions and the P-type active region are present together. Moreover, the width L of the portions where both the N-type active regions and P-type active region are present is regulated by the manufacturing processes, and a region undergoes zener breakdown more readily the smaller the width.

A single zener zap device is accordingly formed with a configuration with portions in which both an N-type active region and a P-type active region are present together, configured on both sides of the P-type active region.

As shown in FIG. 1, the metal wiring line 4 is commonly connected to each of the electrodes $2_0$ to $2_n$ through respective vias 5, and supplies writing and reading voltages to the cathode regions through each of the electrodes $2_0$ to $2_n$. The electrodes $3_1$ to $3_n$ are connected to the respective anode regions of each of the zener zap devices $ZAP_1$ to $ZAP_n$, and each of the electrodes $3_1$ to $3_n$ is connected to a circuit, not shown in the drawings, that performs data reading or data writing.

Each of the zener zap devices $ZAP_1$ to $ZAP_n$ is provided with two cathode regions and one anode region formed between the two cathode regions, with one of the two cathode regions shared with an adjacent zener zap device, and the zener zap devices $ZAP_1$ to $ZAP_n$ connected together in parallel by the metal wiring line 4. The metal wiring line 4 extends along the length direction of the PN junction portions of the anode regions and the cathode regions.

Explanation follows regarding a data writing operation of the thus configured non-volatile memory 1.

For example, when data is written to the zener zap device $ZAP_1$, a writing voltage HV is applied to the metal wiring line 4. Since the cathode regions of each of the zener zap devices $ZAP_1$ to $ZAP_n$ are connected to the metal wiring line 4 through the electrodes $2_0$ to $2_n$ using the vias 5, the cathode regions respectively reach voltage HV.

In this state, with the electrode $3_1$ connected to the anode region of the zener zap device $ZAP_n$ placed at ground level, and the electrodes $3_2$ to $3_n$ connected to the anode regions of the respective zener zap devices $ZAP_2$ to $ZAP_n$ placed at high impedance, data is written to the zener zap device $ZAP_1$ since the voltage HV is only applied between the cathode region and the anode region of the zener zap device $ZAP_1$.

When this occurs, the metal wiring line 4 is disposed over the zener zap device $ZAP_1$, and since the metal wiring line 4 has high thermal conductivity, heat is dissipated by the metal wiring line 4 even when the zener zap device $ZAP_1$ generates heat due to writing data to the zener zap device $ZAP_1$.

Similarly, data is subsequently written to each writing target zener zap device by making the electrode connected to the anode region of the writing target zener zap device ground level, and placing the electrodes connected to the anode regions of zener zap devices other than the writing target zener zap device at high impedance.

Accordingly, although in the non-volatile memory 1 of the present example the metal wiring line 4 is additionally required compared to a layout of a related non-volatile memory, efficient heat dissipation of the heat generated when writing data to the zener zap devices can be achieved due to the metal wiring line 4 being disposed above the zener zap devices. An increase in resistance of lines during writing data to the zener zap device can accordingly be prevented, and moreover a drop in reliability of lines due to for example electromigration or stress migration can also be prevented.

Figure 4:
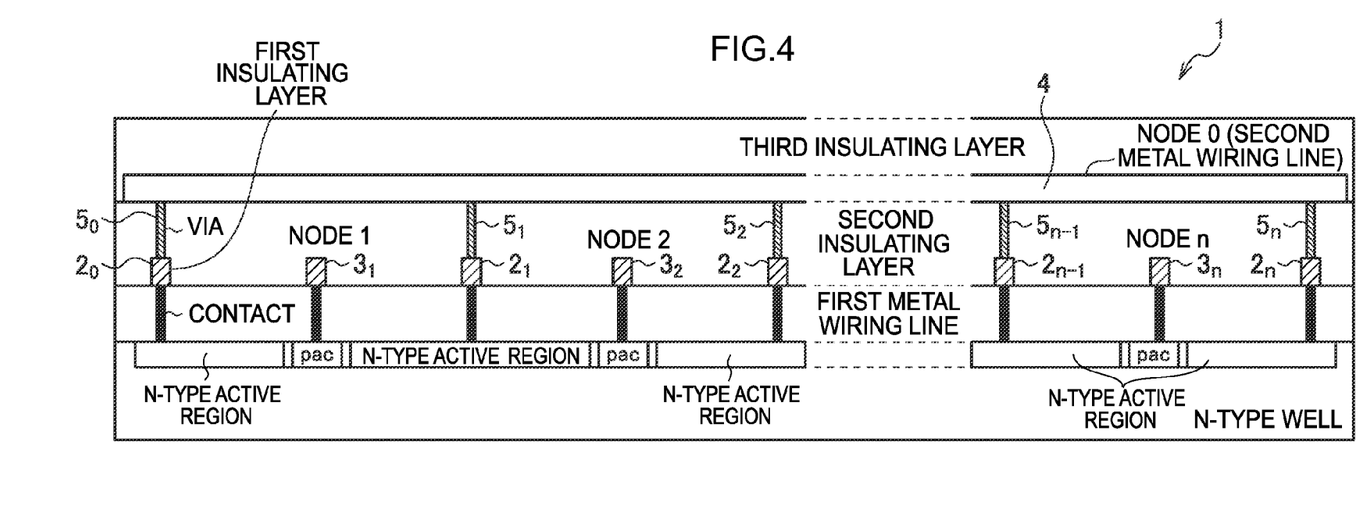
FIG. 4 is a cross-section illustrating a configuration example of the non-volatile memory illustrated in FIG. 1.

FIG. 4 is a cross-section of the non-volatile memory 1 of FIG. 1. Each N-type active region (cathode) is individually connected using a contact to the respective first metal wiring line $2_0$ to $2_n$ provided on a first insulating layer, and is also commonly connected through vias $5_0$ to $5_n$ from the first metal wiring line to the metal wiring line 4 (denoted "second metal wiring line" in the drawings) serving as the node 0 in FIG. 1 that is provided on a second insulating layer.

Each P-type active region pac (anode) is individually connected using a contact to respective metal wiring lines serving as nodes $3_1$ to $3_n$ provided on the first insulating layer.

Figure 5:
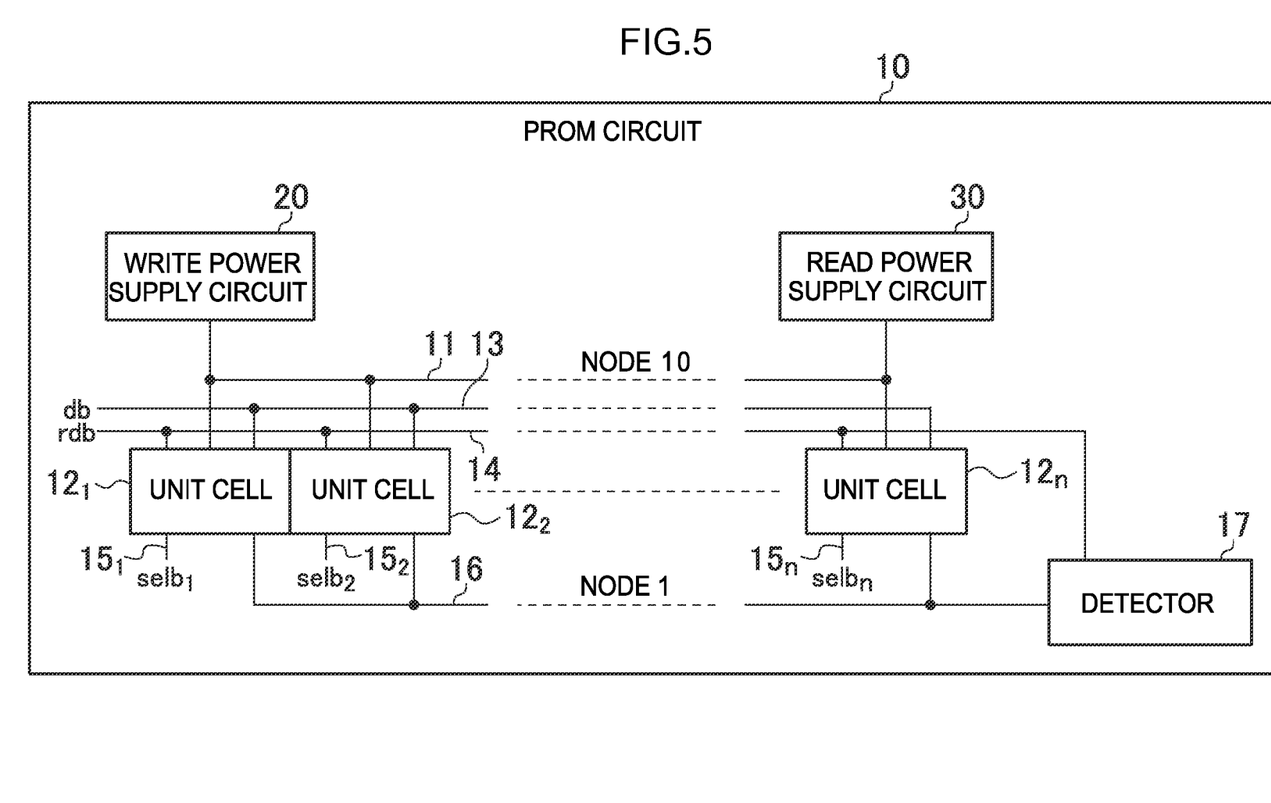
FIG. 5 is a circuit diagram illustrating a configuration example of a storage element circuit employing the non-volatile memory illustrated in FIG. 1.
Figure 6:
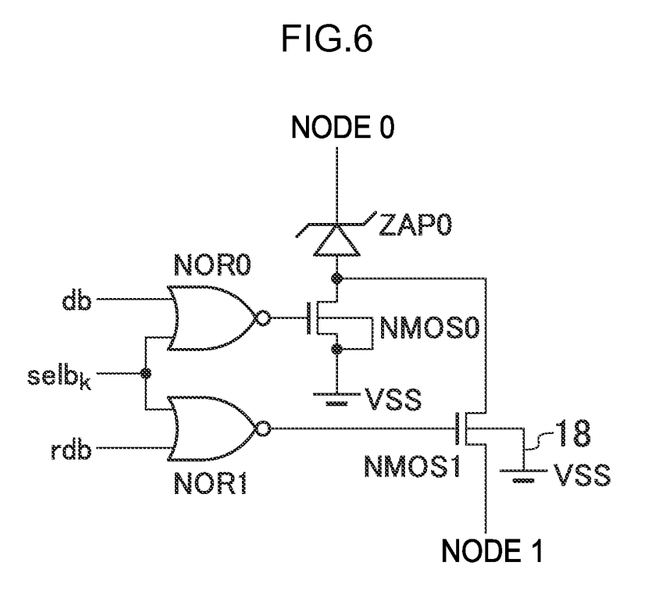
FIG. 6 is a layout diagram illustrating a configuration example of the storage element circuit illustrated in FIG. 5.
Figure 7:
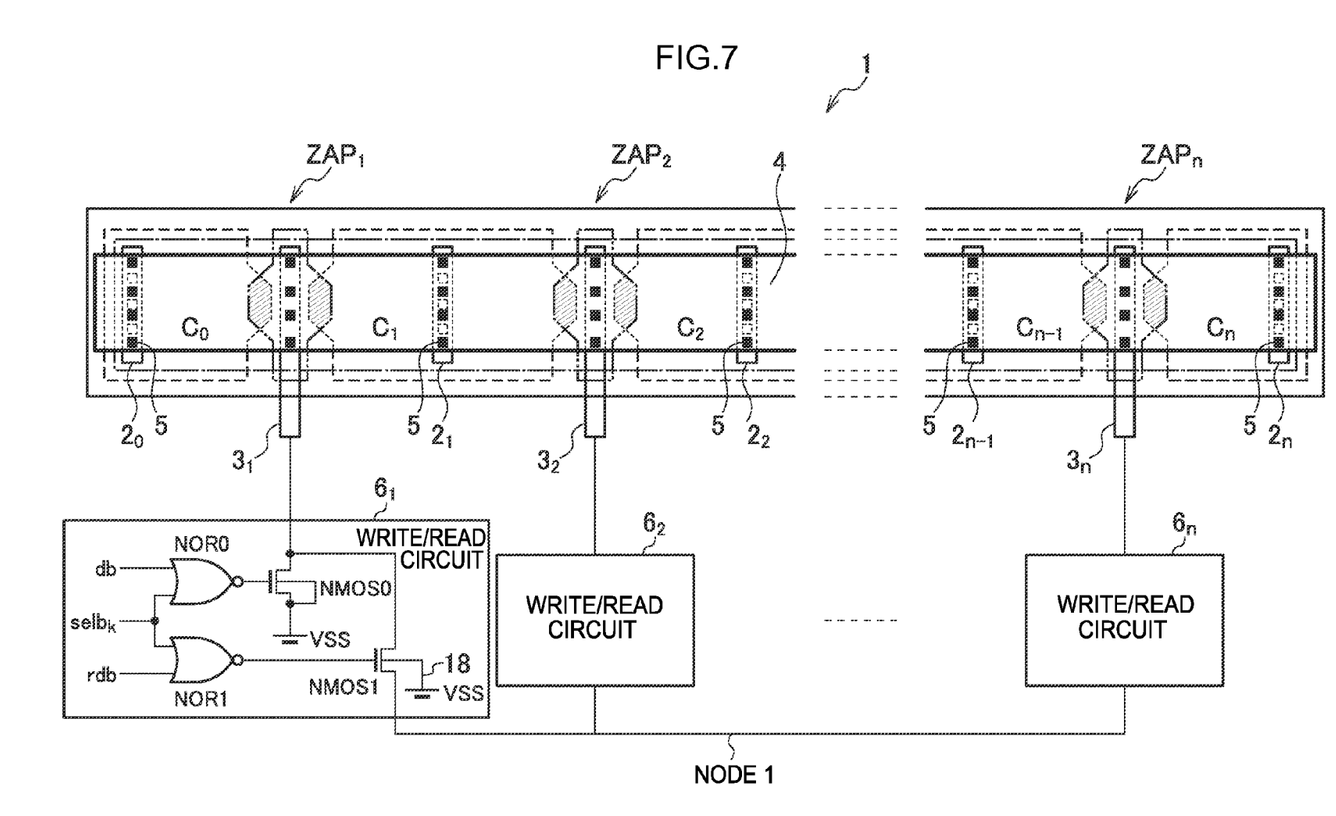
FIG. 7 is a circuit diagram illustrating a configuration example of a non-volatile memory employed in the storage element illustrated in FIG. 5.

Next, explanation follows regarding a circuit configuration of a PROM circuit that employs the non-volatile memory 1 configured as illustrated in FIG. 1 and FIG. 4, with reference to FIG. 5 to FIG. 7.

FIG. 5 shows a configuration of a PROM circuit 10 employing the non-volatile memory illustrated in FIG. 1. The non-volatile memory circuit 10 includes: a write power supply circuit 20; a read power supply circuit 30; a power supply line 11 (also referred to below as node 0) that selectively supplies a data write voltage from the write power supply circuit 20 or a data read voltage from the read power supply circuit 30; n (n being an integer of two or more) individual unit cells $12_1$ to $12_n$ that each stores one bit of data, as shown in detail in FIG. 2, and that are respectively connected in parallel between the power supply line 11 and a reference power supply line connected to ground level, not shown in the drawings, the unit cells $12_1$ to $12_n$ each serving as a storage element section; signal lines 13, 14, and $15_1$ to $15_n$ that input each signal (db, rdb, $selb_1$ to $selb_n$) input from an externally provided control section to each of the unit cells $12_1$ to $12_n$; and a detector 17 during data reading that is input through an output line 16 (also referred to below as node 1) with an output current from the unit cells $12_1$ to $12_n$.

Since each of the unit cells $12_1$ to $12_n$ illustrated in FIG. 5 is of a similar configuration to each other, explanation follows regarding a $k^{th}$ (k=1, 2, . . . , n) unit cell illustrated in FIG. 6.

This unit cell includes: a zener zap device ZAPk with a cathode connected to the node 0 (power supply line 11); a transistor NMOS 0 connected to the anode of the zener zap device ZAPk and connecting the zener zap device ZAPk to a ground level reference voltage VSS during data writing; and a transistor NMOS 1 connected to the anode of the zener zap device ZAPk that connects the zener zap device ZAPk to the node 1 (output line 16) during data reading. Moreover, the present example includes a NOR circuit NOR 0 and a NOR circuit NOR 1 that control the transistor NMOS 0 and the transistor NMOS 1 according to data write operations or data read operations.

A signal db in FIG. 6 is a write instruction signal, a signal $selb_k$ is a selection instruction signal for selecting the $k^{th}$ unit cell, and a signal rdb is a read instruction signal. These signals are respectively input from a control section, not shown in the drawings, to the respective terminals of the NOR circuit NOR 0 and the NOR circuit NOR 1 through the signal line 13, the signal line $15_k$, and the signal line 14 shown in FIG. 5.

The transistor NMOS 0 and the transistor NMOS 1 are N channel MOS transistors, and the reference voltage VSS is at ground level (ground).

In the zener zap device ZAPk, the cathode is connected to the power supply line (node 0) 11, and the anode is commonly connected to the respective drains of the transistor NMOS 0 and the transistor NMOS 1.

The gate of the transistor NMOS 0 is connected to the output terminal of the NOR circuit NOR 0, and the source of the transistor NMOS 0 is connected to the reference voltage VSS (ground level) through a reference power supply line 18. The gate of the transistor NMOS 1 is connected to the output terminal of the NOR circuit NOR 1, and the source of the transistor NMOS 1 is connected to the output line (node 1) 16.

One input terminal of the NOR circuit NOR 0 is input with the signal db, and the other input terminal is commonly connected together with one input terminal of the NOR circuit NOR 1 and is input with the signal $selb_k$. The other input terminal of the NOR circuit NOR 1 is input with the signal rdb.

Prior to writing, the zener zap device ZAPk acts as a diode and current accordingly does not flow from the cathode to the anode. However after writing the zener zap device ZAPk is shorted and so current flows from the cathode to the anode.

Note that there is no limitation to such a configuration as long as the logic circuit including the NOR circuit NOR 0 and the NOR circuit NOR 1 operates during writing so as to switch ON the corresponding transistor NMOS 0 based on the unit selecting signal $selb_k$, and operates during reading to switch ON the corresponding transistor NMOS 1.

In the non-volatile memory circuit 10 illustrated in FIG. 5, configuration is made with n of the individual unit cells illustrated in FIG. 6 connected together in parallel between the power supply line 11 (node 0) and the output line 16 (node 1), and as described above includes the unit cells $12_1$ to $12_n$, the write power supply circuit 20, the read power supply circuit 30, and the detector 17.

The write power supply circuit 20 is a circuit for supplying a write voltage (HV) from an external power source when writing to the zener zap devices, and the read power supply circuit 30 is a circuit for supplying a read voltage (IVC) from the external power source when reading from the zener zap devices. The detector 17 is a circuit for detecting current flowing in each of the zener zap devices and converting the current into a voltage.

In FIG. 5, the signal line 13 transmitting the signal db is commonly connected to the signal db input terminal of the NOR circuit NOR 0 of each of the unit cells $12_1$ to $12_n$ such as illustrated in FIG. 6. The signal lines $15_1$ to $15_n$ transmitting the signals $selb_1$ to $selb_n$ are respectively connected to the signal $selb_k$ input terminals of the NOR circuit NOR 0 and the NOR circuit NOR 1 of each of the unit cells $12_1$ to $12_n$ such as illustrated in FIG. 6. The signal line 14 transmitting the signal rdb is commonly connected to the signal rdb input terminal of the NOR circuit NOR 1 of each of the unit cells $12_1$ to $12_n$ such as illustrated in FIG. 6.

The power supply line 11 is commonly connected as the node 0 to each of the unit cells $12_1$ to $12_n$ such as illustrated in FIG. 6, and the output line 16 is commonly connected, as the node 1 of each of the unit cells $12_1$ to $12_n$ such as illustrated in FIG. 6, to the input of the detector 17.

Explanation follows regarding operation of the thus configured non-volatile memory circuit 10.

First, explanation is given regarding a data write operation of the zener zap device ZAPk. Explanation is given of a data writing operation to the unit cell $12_k$ as illustrated in FIG. 5.

In order to write data to the zener zap device ZAPk, a higher voltage (HV) than the power supply voltage is applied to the cathode in order to cause zener breakdown to occur, and so the power supply line 11 (node 0) is made voltage HV. The signal selb$_k$ is made ground level (L) to select the unit cell 12$_k$, and the signal db is made L and the signal rdb is made H.

When in this signal state, the output of the NOR circuit NOR 0 in FIG. 6 is H, the output of the NOR circuit NOR 1 is L, the transistor NMOS 0 is ON, and the transistor NMOS 1 is OFF.

The anode of the zener zap device ZAPk is accordingly connected to the ground level reference voltage VSS, the zener zap device ZAPk undergoes zener breakdown and data is written thereto. Data writing can also be performed in a similar manner for the other zener zap devices.

In the non-volatile memory circuit 10 of the present example, as shown in FIG. 1 and FIG. 4, the metal wiring line 4 is disposed above each of the zener zap devices of each of the unit cells 12$_1$ to 12$_n$. The metal wiring line 4 has high thermal conductivity, and even though the zener zap devices generate heat during data writing, this heat is dissipated by the metal wiring line 4.

Explanation of a data read operation follows, giving an example of a case in which the zener zap device of the unit cell 12$_k$ has been written to (referred to below as data 1), and the zener zap device of the unit cell 12$_{k+1}$ has not yet been written to (referred to below as data 0).

Each signal of the signal db, the signal rdb, and signals selb$_1$ to selb$_n$ in FIG. 5 are input at H, and the power supply line 11 (node 0) and the output line 16 (node 1) are placed at ground level.

In FIG. 6, since the signal selb$_k$ is H, the signal db is H and the signal rdb is H for the unit cells 12$_1$ to 12$_n$, the NOR circuit NOR 0 and the NOR circuit NOR 1 accordingly both output L, the transistor NMOS 0 and the transistor NMOS 1 are both OFF, and current of the zener zap devices does not flow to the detector 17 regardless of the data in each of the zener zap devices.

When from this state L is input as the signal rdb, the voltage IVC is supplied from the read power supply circuit 30 to the node 0 (power supply line 11), and a voltage of around 0.3V is supplied from the detector 17 to the node 1 (output line 16).

Next, the signal selb$_k$ in FIG. 5 is input as L through the signal line 15$_k$. When this occurs, in each of the unit cells other than the unit cell 12$_k$, in FIG. 6 the signals selb$_1$ to selb$_n$ other than the signal selb$_k$ are H, the signal db is H, and the signal rdb is L. The NOR circuit NOR 0 and the NOR circuit NOR 1 thereof both accordingly output L, making the transistor NMOS 0 and the transistor NMOS 1 both OFF, and current of the zener zap devices does not flow to the detector 17 regardless of the data in each of the zener zap devices.

However, in the unit cell 12$_k$ of FIG. 5, since in FIG. 6 the signal selb$_k$ is L, the signal db is H, and the signal rdb is L, the NOR circuit NOR 0 outputs L and the NOR circuit NOR 1 outputs H, making the transistor NMOS 0 OFF and the transistor NMOS 1 ON. Since the zener zap device of the unit cell 12$_k$ holds data 1, current flows to the node 1 (output line 16).

When this occurs, the current that flows in the zener zap device is twice a reference current, and so the voltage of the node 1 (output line 16) becomes higher than 0.3V. A high voltage (H) is accordingly output from the detector 17.

Note that the rise in voltage of node 1 (output line 16) during the data read operation can be suppressed to a voltage within a predetermined voltage swing by configuring a negative feedback circuit in the detector 17 to perform amplitude control.

Next, H is input as the signal selb$_k$ from the signal line 15$_k$ to the unit cell 12$_k$ in FIG. 5, and L is input as the signal selb$_{k+1}$ from the signal line 15$_{k+1}$ to the unit cell 12$_{k+1}$. When this occurs, in each of the unit cells other than the unit cell 12$_{k+1}$, since in FIG. 6 the signals selb$_1$ to selb$_n$ other than the signal selb$_{k+1}$ are H, the signal db is H, and the signal rdb is L, the NOR circuit NOR 0 and the NOR circuit NOR 1 both output L, making the transistor NMOS 0 and the transistor NMOS 1 both OFF, and current of the zener zap devices does not flow to the detector 17 regardless of the data in each of the zener zap devices.

However, in the unit cell 12$_{k+1}$, since in FIG. 6 the signal selb$_{k+1}$ is L, the signal db is H, and the signal rdb is L, the NOR circuit NOR 0 outputs L and the NOR circuit NOR 1 outputs H, making the transistor NMOS 0 OFF and the transistor NMOS 1 ON.

Current does not however flow in the zener zap device of the unit cell 12$_{k+1}$ since it holds data 0. Accordingly, the voltage of the node 1 (output line 16) in FIG. 5 becomes a voltage lower than 0.3V. As a result, L is output from the detector 17.

Similarly, data written to subsequent read target zener zap devices can be read by making the selection signal of each of the read target zener zap devices L, and making the selection signal of all the zener zap devices other than the read target zener zap device H.

FIG. 7 shows an example of a layout of unit cells of the PROM circuit 10 illustrated in FIG. 5 that employs the non-volatile memory 1 illustrated in FIG. 1. In FIG. 7, write/read circuits 6$_1$ to 6$_n$ are configured, as shown in the illustrated example of the write/read circuit 6$_1$, with each of the circuit elements of the unit cell illustrated in FIG. 6, but excluding the zener zap device ZAPk.

Accordingly, in the PROM circuit 10 of FIG. 5, heat generated accompanying zener breakdown of the zener zap device ZAPk during a data write operation can be dissipated by the metal wiring line 4 due to employing the non-volatile memory 1 configured as illustrated in FIG. 1.

Figure 8:
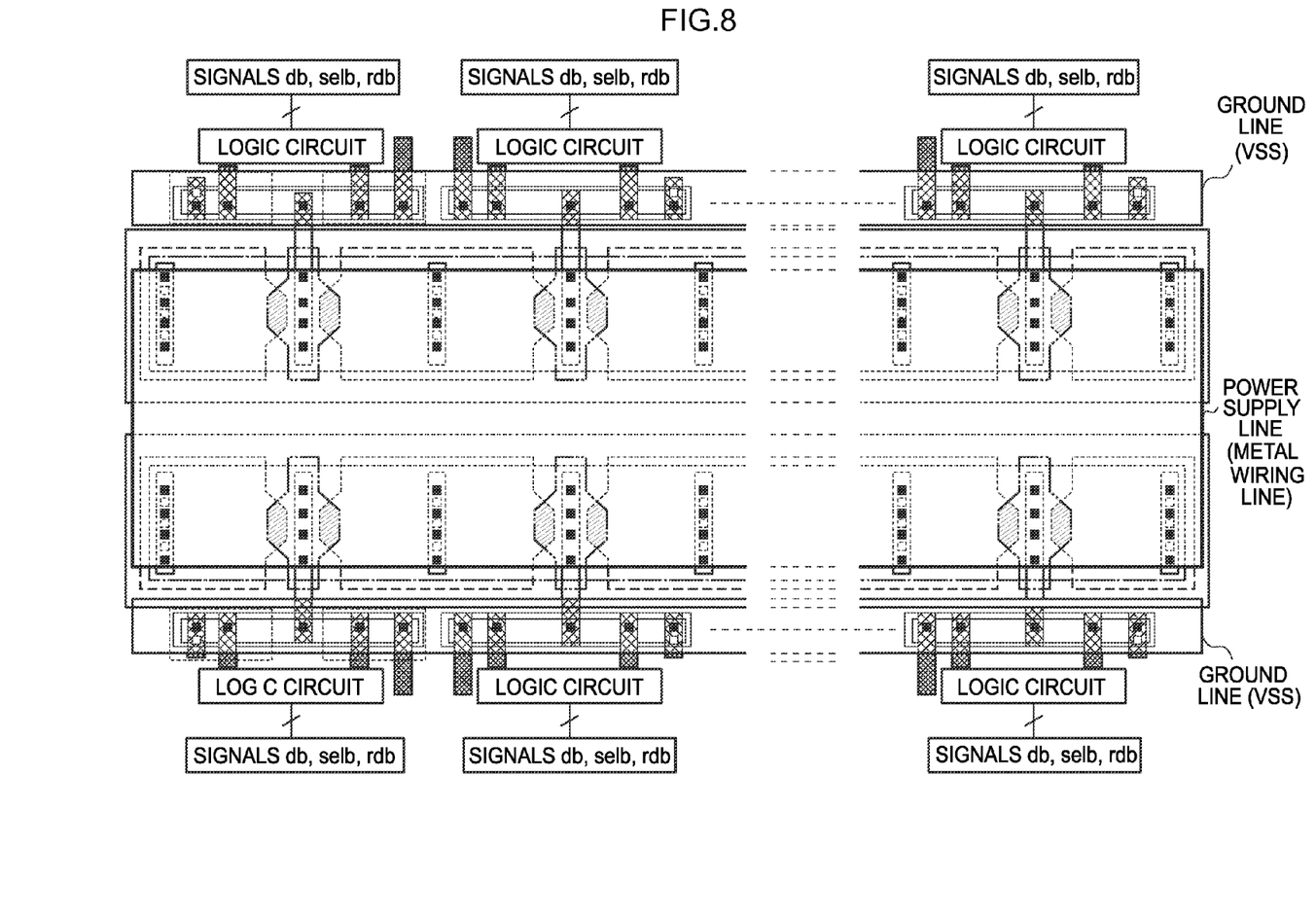
FIG. 8 is a layout diagram illustrating another configuration example of a non-volatile memory according to an exemplary embodiment.

FIG. 8 shows another configuration example of non-volatile memory according to an exemplary embodiment configured such that plural sets of the non-volatile memory of FIG. 1 are covered by a single metal wiring line. Such a configuration accommodates increases in capacity of non-volatile memory.

In FIG. 8, plural zener zap device groups are configured from plural individual rows of zener zap devices provided adjacent to each other. A metal wiring line 4 serving as a power supply line is formed spanning the region where the plural adjacent zener zap device groups are formed.

The logic circuits in FIG. 8 are configured including the NOR circuits illustrated in FIG. 6, and the portions shown with broken lines at the bottom left of FIG. 8 are circuits provided with the NMOS transistors, illustrated in FIG. 6, for example with the source of the transistor NMOS 0 in FIG. 6 connected to a ground line (VSS) illustrated in FIG. 8 and with the source of the transistor NMOS 1 in FIG. 6 connected to a node 1 in FIG. 8.

Moreover, the ground line (VSS) connected to the transistor NMOS 0 of FIG. 6 is commonly connected to adjacent of the transistor NMOS 0 of FIG. 6 and extends similarly to the power supply line (metal wiring line 4) along the length direction of the PN junction portions of the anode regions and the cathode regions of the zener zap devices.

Accordingly, the configuration of the non-volatile memory of the exemplary embodiment illustrated in FIG. 8 includes transistors with one end connected to the ground line and the other end connected to the anode of the respective zener zap devices, with the ground line formed adjacent to the power supply line configured by the metal wiring line.

Configuration includes a first zener zap device group configured by plural zener zap devices disposed in sequence along a first direction and a second zener zap device group configured by plural zener zap devices other than the zener zap devices of the first group disposed in sequence along the first direction. The metal wiring line (power supply line) is formed spanning the first zener zap device group and the second zener zap device group.

Moreover, configuration includes transistors NMOS 0 such as illustrated in FIG. 6, with a first end connected to a ground line and the other end connected to the anode of the respective zener zap device. Plural ground lines are formed spanning along the first direction, and the metal wiring line is disposed between the ground lines.

In such a configuration, the metal wiring line 4 (power supply line) is formed between the two ground lines, and an even better heat dissipation effect can be obtained by configuring as illustrated in FIG. 8.

Figure 9:
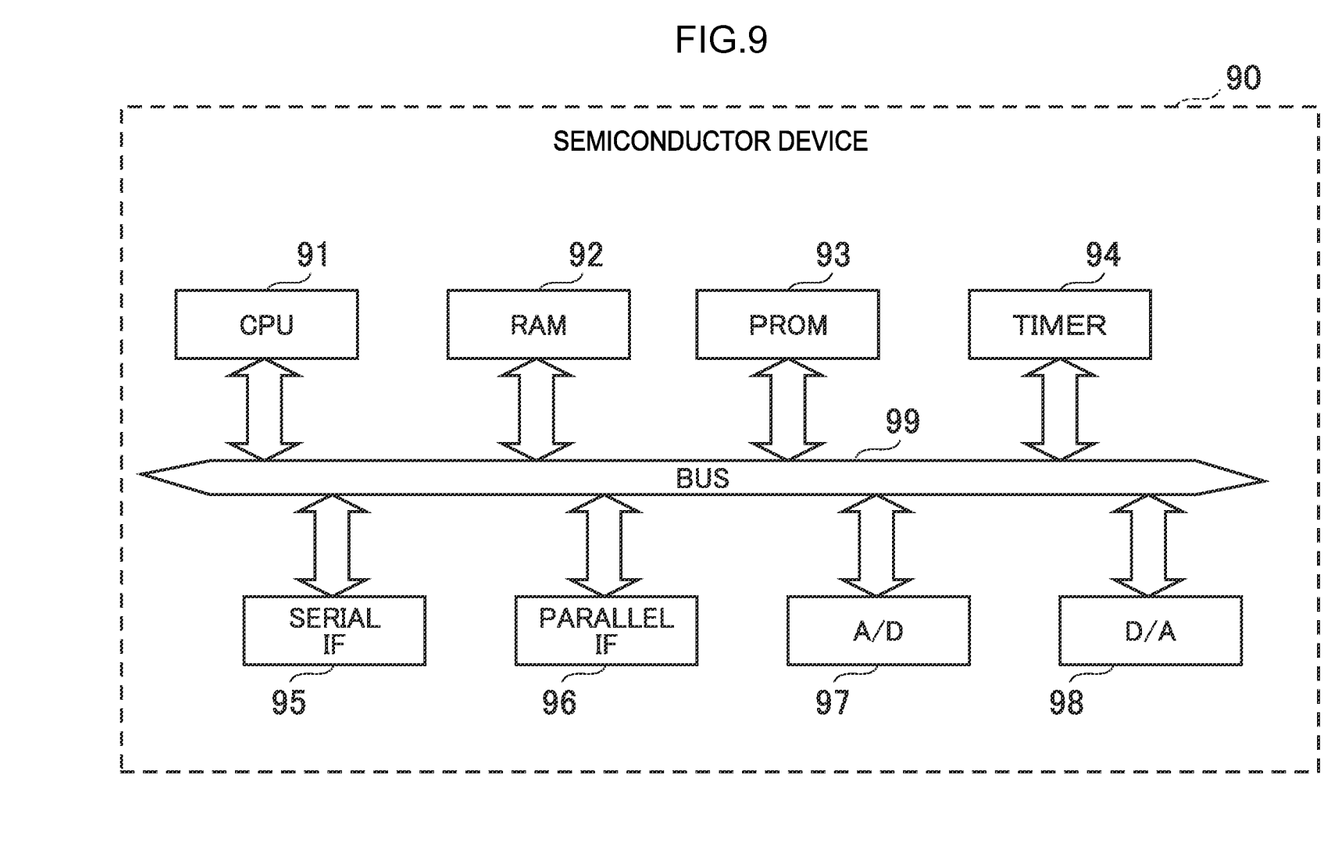
FIG. 9 is a block diagram illustrating a configuration example of a semiconductor device provided with a non-volatile memory according to an exemplary embodiment.

Explanation follows regarding a semiconductor device employing such a non-volatile memory circuit 10, with reference to FIG. 9.

FIG. 9 illustrates a semiconductor device 90 of the present example that includes a CPU 91, RAM 92, a PROM 93 according to the present invention, a timer (denoted "TIMER" in FIG. 9) 94, a serial interface (denoted "SERIAL IF" in FIG. 9) 95, a parallel interface (denoted "PARALLEL IF" in FIG. 9) 96, an AD converter (denoted "A/D" in FIG. 9) 97, and a DA converter (denoted "D/A" in FIG. 9) 98, with these connected together through a BUS 99.

For example, the RAM 92 is configured with 1024 bytes, and the PROM 93 is configured with 60 kilobytes of capacity. The CPU 91 (a central processing unit) performs writing and reading of programs and data to and from the PROM 93 based on control signals from an external device connected through the serial interface 95 or the parallel interface 96.

The thus configured semiconductor device 90 is for example provided to various types of control boards employed in vehicle control, to various types of control board of manufacturing equipment, or to various types of electrical component in for example a mobile telephone.

As explained above with reference to the drawings, the non-volatile memory 1 of the present example illustrated in FIG. 1 includes the plural zener zap devices $ZAP_1$ to $ZAP_n$, each provided with the cathode region and the anode region formed in a well, and the metal wiring line 4 that is formed above the zener zap devices $ZAP_1$ to $ZAP_n$, that is commonly connected to the electrodes $2_0$ to $2_n$ of each of the cathode regions through the vias 5 and that supplies a write voltage to the cathode regions.

The metal wiring line 4 is moreover formed so as to at least cover overlapping portions of cathode regions and the anode regions in the well.

Moreover, configuration is such that each of the plural zener zap devices $ZAP_1$ to $ZAP_n$ is provided with two cathode regions and one anode region formed between the two cathode regions, with one of the two cathode regions commonly shared with an adjacent zener zap device, and each of the zener zap devices $ZAP_1$ to $ZAP_n$ connected in parallel to the metal wiring line 4.

Thus in the non-volatile memory 1 of the present example, the metal wiring line 4 is accordingly capable of dissipating heat generated accompanying zener breakdown of the zener zap devices $ZAP_1$ to $ZAP_n$ during data write operations. It is accordingly possible to avoid an increase in heat generation accompanying increases in capacities of non-volatile memory (PROM) employing zener zap devices, thereby enabling stabilization to be achieved in the operation of semiconductor devices or electrical components provided with such non-volatile memory (PROM).

Note that the present invention is not limited to the examples explained with reference to each of the drawings, and various modifications are possible within a range not departing from the spirit of the present invention. For example in the present example, in the non-volatile memory circuit 10 explained using FIG. 5, explanation has been given of an example wherein the node 0 and the node 1 are at ground level apart from during read operations or write operations. However, it is also possible to eliminate a time delay when the signal input as the signal rdb is switched from H to L by making the node 0 IVC, and making the node 1 a detector input voltage level of around 0.3V at all times other than during write operations.

Moreover, explanation has been given of an example wherein the HV from the write power supply circuit 20 and IVC from the read power supply circuit 30 are supplied in the non-volatile memory circuit 10 illustrated in FIG. 5, however configuration may be made with direct supply from pads.

In the present example, an example is shown wherein the metal wiring line 4 is disposed above the zener zap devices (ZapFuses) configured in a single layer. However in multi-layer wiring configurations it is also possible to dispose respective metal wiring lines above zener zap devices of each layer, with improved wiring layout efficiency expected therefrom.

In the non-volatile memory of the present example, configuration is made with the dual-presence regions of both the cathode region and the anode region respectively provided between the two cathode regions and the one anode region, however configuration may also be made with a single cathode region.

The invention claimed is:

1. A non-volatile memory comprising:
   a plurality of zener zap devices, each of the zener zap devices including a cathode region on each side of an anode region and a dual-presence region in which both a cathode region and an anode region are present between each cathode region and the respective side of the anode region, wherein the plurality of zener zap devices are arranged in a linear direction such that a zener zap device of the plurality of zener zap devices shares two cathode regions with adjacent zener zap devices of the plurality of zener zap devices; and
   a metal wiring line overlapping each dual-presence region of the plurality of zener zap devices, commonly connected to each of the cathode regions.

2. The non-volatile memory of claim 1, wherein the metal wiring line is formed so as to cover at least the cathode region and the anode region formed in the well.

3. The non-volatile memory of claim 1, wherein the plurality of zener zap devices are positioned one by one adjacent to one another to extend linearly along a same direction in which the metal wiring line extends, and the plurality of zener zap devices are connected in parallel by the metal wiring line.

4. The non-volatile memory of claim 1, wherein the metal wiring line is formed in a layer above a layer of wiring connecting the anode region.

5. The non-volatile memory of claim 1, further comprising a transistor with one end connected to a ground line, another end connected to an anode of the zener zap device, and the ground line formed adjacent to the metal wiring line.

6. The non-volatile memory of claim 1, further comprising:
   a first zener zap device group configured by the plurality of zener zap devices disposed in sequence along a first direction; and
   a second zener zap device group configured by a plurality of zener zap devices other than the zener zap devices of the first group disposed in sequence along the first direction, and wherein the metal wiring line is formed spanning the first zener zap device group and the second zener zap device group.

7. The non-volatile memory of claim 6, further comprising:
   a transistor with one end connected to a ground line and another end connected to an anode of the zener zap devices; and
   a plurality of the ground lines that are formed spanning along the first direction, wherein the metal wiring line is disposed between the ground lines.

8. A semiconductor device comprising:
   the non-volatile memory of claim 1; and
   a central processing unit that performs writing and reading of data employing the non-volatile memory.

9. The non-volatile memory of claim 1, wherein each dual presence region includes opposing and substantially parallel sides extending in a first direction and respectively corresponding to a width of a protruding edge of the anode region and a width of a protruding edge of the cathode region, and the width of the protruding edge of the anode region and the width of a protruding edge of the cathode region are each less than a width of the dual presence region in the first direction between the protruding edges.

10. A non-volatile memory comprising:
    a plurality of zener zap devices, each of the zener zap devices including two cathode regions and an anode region, and zener zap devices arranged in a linear direction such that a zener zap device of the plurality of zener zap devices shares two cathode regions with adjacent zener zap devices of the plurality of zener zap devices; and
    a metal wiring line commonly connected to each of the cathode regions and substantially overlapping in a plan view of the well surface all the anodes and cathodes of the plurality of zener zap devices.

11. The non-volatile memory of claim 10, wherein the metal wiring line is formed in a layer above a layer of wiring connecting the anode region.

12. The non-volatile memory of claim 10, wherein each of the zener zap devices include a dual-presence region positioned between the cathode region and the anode region, the dual-presence region having both a cathode region and an anode region.

13. The non-volatile memory of claim 12, wherein each dual presence region includes opposing and substantially parallel sides extending in a first direction and respectively corresponding to a width of a protruding edge of the anode region and a width of a protruding edge of the cathode region, and the width of the protruding edge of the anode region and the width of a protruding edge of the cathode region are each less than a width of the dual presence region in the first direction between the protruding edges.

* * * * *